United States Patent
Sahni et al.

(10) Patent No.: US 11,101,726 B2
(45) Date of Patent: Aug. 24, 2021

(54) GLITCH IMMUNE NON-OVERLAP OPERATION OF TRANSISTORS IN A SWITCHING REGULATOR

(71) Applicant: TEXAS INSTRUMENTS INCORPORATED, Dallas, TX (US)

(72) Inventors: Subhash Sahni, Dehradun (IN); Murugesh Subramaniam, Bengaluru (IN); Pranav Sinha, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/589,799

(22) Filed: Oct. 1, 2019

(65) Prior Publication Data
US 2021/0099070 A1   Apr. 1, 2021

(51) Int. Cl.
| | |
|---|---|
| *H02M 1/38* | (2007.01) |
| *H02M 1/08* | (2006.01) |
| *H03K 17/284* | (2006.01) |
| *H03K 17/08* | (2006.01) |
| *H02M 3/157* | (2006.01) |
| *H02M 3/158* | (2006.01) |
| *H03K 19/20* | (2006.01) |

(52) U.S. Cl.
CPC ............... *H02M 1/08* (2013.01); *H02M 1/38* (2013.01); *H02M 3/157* (2013.01); *H02M 3/158* (2013.01); *H03K 17/08* (2013.01); *H03K 17/284* (2013.01); *H03K 19/20* (2013.01); *H03K 2017/0806* (2013.01)

(58) Field of Classification Search
CPC .......... H02M 1/38; H02M 1/08; H02M 3/157; H02M 3/158; H03K 17/284; H03K 17/08; H03K 2017/0806; H03K 19/20
See application file for complete search history.

(56) References Cited

U.S. PATENT DOCUMENTS

| | | | |
|---|---|---|---|
| 9,307,623 B1* | 4/2016 | Mays, II | H02M 7/53803 |
| 2016/0248412 A1* | 8/2016 | Kadowaki | H03K 5/1515 |
| 2018/0131282 A1* | 5/2018 | Chen | H02M 1/38 |
| 2018/0269806 A1* | 9/2018 | Chen | H02M 1/38 |
| 2020/0036287 A1* | 1/2020 | Peretz | G05F 1/575 |

* cited by examiner

*Primary Examiner* — Harry R Behm
(74) *Attorney, Agent, or Firm* — Ebby Abraham; Charles A. Brill; Frank D. Cimino

(57) ABSTRACT

A circuit includes a first gate control circuit including a first time delay element and first and second logic gates. The first time delay element and first and second logic gates receive a pulse width modulation (PWM) signal. The first logic gate includes a first output and second logic gate includes a second output. The circuit also includes a second gate control circuit that includes a second time delay element and third and fourth logic gates. The second time delay element includes an input coupled to the output of the first time delay element. The third logic gate includes a third output, and the fourth logic gate includes a fourth output. A first gate driver receives a first signal from one of the first or third outputs. A second gate driver receives a second signal from one of the second or fourth outputs.

16 Claims, 8 Drawing Sheets

GLITCH IMMUNE NON-OVERLAP OPERATION OF TRANSISTORS IN A SWITCHING REGULATOR

BACKGROUND

Switching converters typically include transistors connected in series between a power node and a ground node. A control circuit turns each transistor on and off with a particular duty cycle to generate a regulated output voltage. The control circuit causes there to be a "dead time" after one transistor is turned off before the other transistor is turned on to ensure that both transistors are not turned on simultaneously. The dead time is also referred to as a non-overlap time.

SUMMARY

In one example, a circuit includes a first gate control circuit including a first time delay element, a first logic gate, and a second logic. The first time delay element includes an output. The first time delay element, the first logic gate, and the second logic gate are configured to receive a pulse width modulation (PWM) signal. The first logic gate includes a first output and the second logic gate includes a second output. The circuit also includes a second gate control circuit that includes a second time delay element, a third logic gate, and a fourth logic gate. The second time delay element includes an input coupled to the output of the first time delay element. The second time delay element includes an output, and the third logic gate includes a third output, and the fourth logic gate includes a fourth output. A first gate driver is configured to receive a first signal from one of the first or third outputs. A second gate driver is configured to receive a second signal from one of the second or fourth outputs.

In another example, a method includes setting a trim code to first value and applying the trim code to a microcontroller. The microcontroller is configured to generate a first transistor control signal and a second transistor control signal. The method further includes reducing the trim code responsive to the both the first transistor control signal being deasserted when the second transistor control signal is asserted, and the second transistor control signal being deasserted when the first transistor control signal is asserted.

BRIEF DESCRIPTION OF THE DRAWINGS

For a detailed description of various examples, reference will now be made to the accompanying drawings in which.

DETAILED DESCRIPTION

Figure 1:
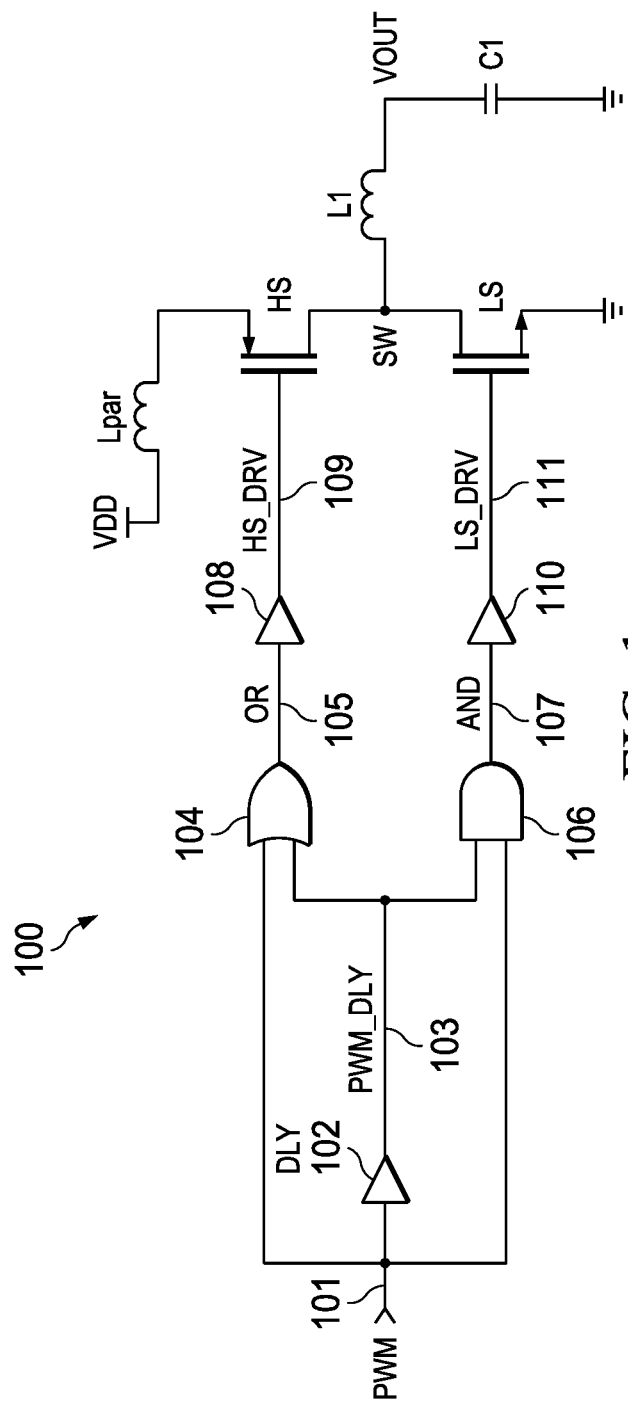
FIG. 1 illustrates an example of a switching regulator.

FIG. 1 shows an example of at least a portion of a switching regulator 100. In this example, switching regulator 100 includes a time delay element 102, an OR gate 104, an AND gate 106, gate drivers 108 and 110, a high side transistor (HS), a low side transistor (LS), an inductor L1, and a capacitor C1. The pulse width modulation (PWM) signal is provided to the input of the time delay element 102, one of the inputs of the OR gate 104, and one of the inputs of the AND gate 106. The PWM signal is used to control the on and off states of the HS and LS transistors with a specific duty cycle that results in an output voltage VOUT being of a specific voltage.

OR gate 104 logically ORs together the PWM signal 101 and the output signal from time delay element 102 (PWM_DLY signal 103). The output signal from OR gate 104 (OR 105) is provided to gate driver 108, which generates the gate drive signal (HS_DRV signal 109) to the gate of the HS transistor. AND gate 106 logically ANDs together the PWM signal 101 and the PWM_DLY signal 103. The output signal from AND gate 106 (AND 107) is provided to gate driver 110, which generates the gate drive signal (LS_DRV signal 111) to the gate of the LS transistor.

In this example, the HS transistor comprises a p-type metal oxide semiconductor field effect transistor (PMOS) and the LS transistor comprises an n-type metal oxide semiconductor field effect transistor (NMOS). In other examples, different types of transistors can be used (e.g., a PMOS instead of an NMOS, an NMOS instead of a PMOS, bipolar junction transistors instead of MOS transistors, etc.). The source of the HS transistor is coupled to a supply voltage node (VDD), and the source of the LS transistor is coupled to a ground node. The drains of the HS and LS transistors are coupled together at a switch node (SW). One terminal of inductor L1 is connected to the SW node, and the other terminal of inductor L1 is connected to capacitor C1. FIG. 1 also illustrates a parasitic inductance Lpar that is present between VDD and the source of the HS transistor. As will be described below, this parasitic inductance Lpar can cause switching noise on the source of the HS transistor, which can at least in part cause a "shoot-through" problem in which both the HS and LS transistors are simultaneously ON.

Figure 2:
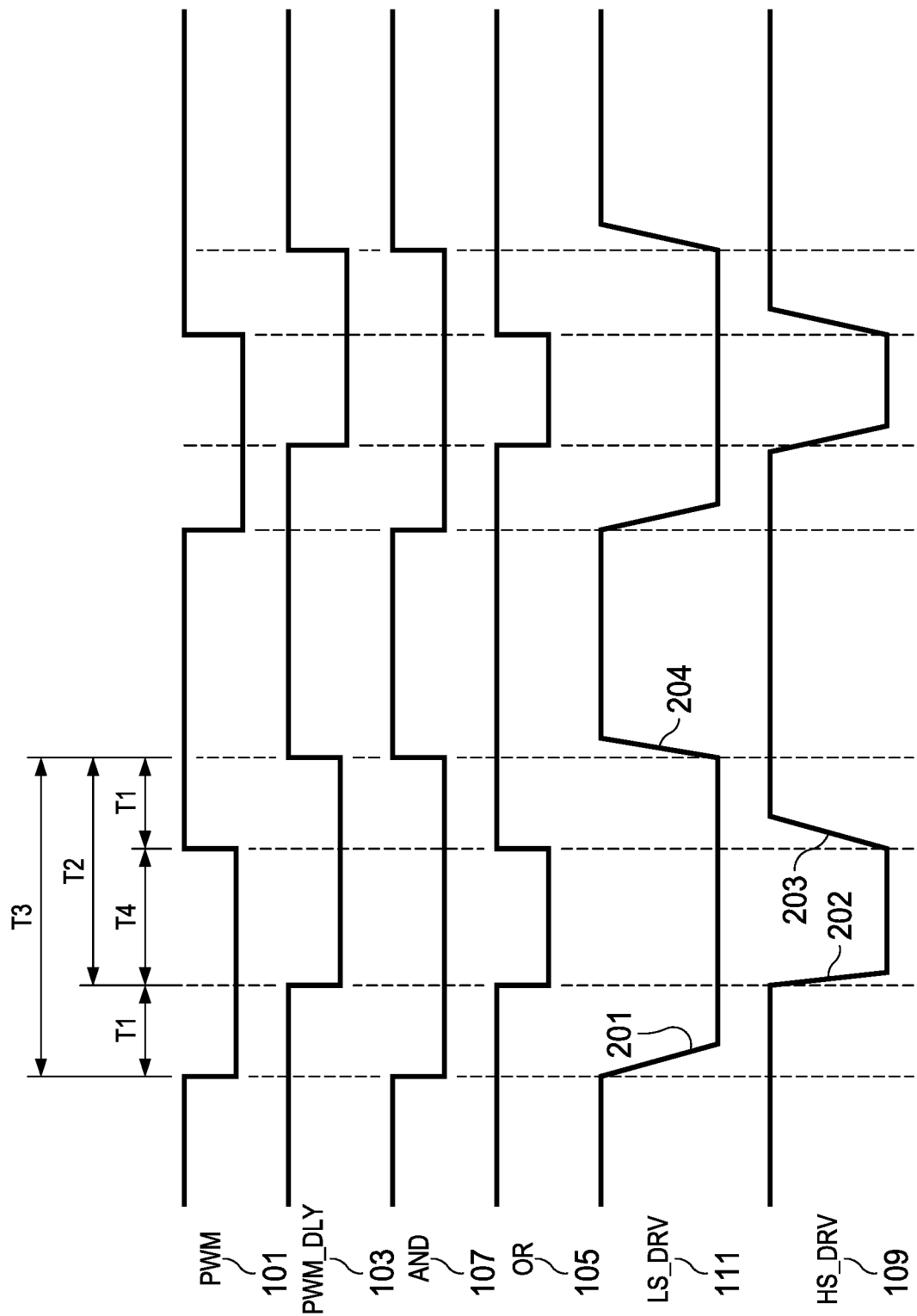
FIG. 2 shows a timing diagram associated with the switching regulator of FIG. 1.

FIG. 2 is a timing diagram illustrating the operation of the switching regulator 100. The PWM_DLY signal 103 is shown as tracking the PWM signal 101, but with a time delay T1 caused by time delay element 102. In one example, T1 is 16 nanoseconds. The width of the negative pulse of PWM_DLY is T2. AND 107 is shown as the logical AND of the PWM signal 101 and the PWM_DLY signal 103. As such, AND 107 is logic low as long as at least one of the PWM and PWM_DLY signals 101 and 103 is logic low. The length of time that AND 107 is low is shown as T3. T3 is T2+T1. Thus, T3 is longer than T2.

OR 105 is shown as the logical OR of the PWM signal 101 and the PWM_DLY signal 103. As such, OR 105 is logic low as long as both of the PWM and PWM_DLY signals 101 and 103 are logic low. The length of time that OR 105 is low is shown as T4. T4 is T2−T1. Thus, T4 is shorter than T2.

As the HS transistor in this example is a PMOS transistor, the HS transistor is on as long as its gate voltage is low (e.g., lower than its source voltage, which is at VDD, by at least the threshold voltage of the transistor). The LS transistor in this example is an NMOS transistor, and thus the LS transistor is on as long its gate voltage is high (e.g., higher than its source, which is at ground, by at least the threshold voltage of the transistor).

The LS_DRV signal 111 and the HS_DRV signal 109 are shown in FIG. 2. HS_DRV is generated by the gate driver 108 responsive to OR 105, and LS_DRV is generated by the gate driver 110 responsive to AND 107. HS_DRV and LS_DRV drive signals generally track their respective OR and AND signals 105 and 107 as shown. The rising and falling edges of the HS_DRV and LS_DRV drive signals are not as sharp (lower slew rate) due to the gate capacitance of the HS and LS transistors.

FIG. 2 shows the LS transistor being turned off at falling edge 201 of the LS_DRV signal. The HS transistor is then turned on at falling edge 202 of the HS_DRV signal. The time period between turning off the LS transistor and subsequently turning on the HS transistor is T1—the non-overlap time introduced by the time delay element 102. Similarly, the HS transistor turns off upon rising edge 203 of the HS_DRV signal followed, after a period of time equal to T1, by the LS transistor subsequently turning on at rising edge 204 of the LS_DRV signal. As such, a non-overlap time (T1) occurs after one of the transistors is turned off and before the other transistor is turned on.

Figure 3:
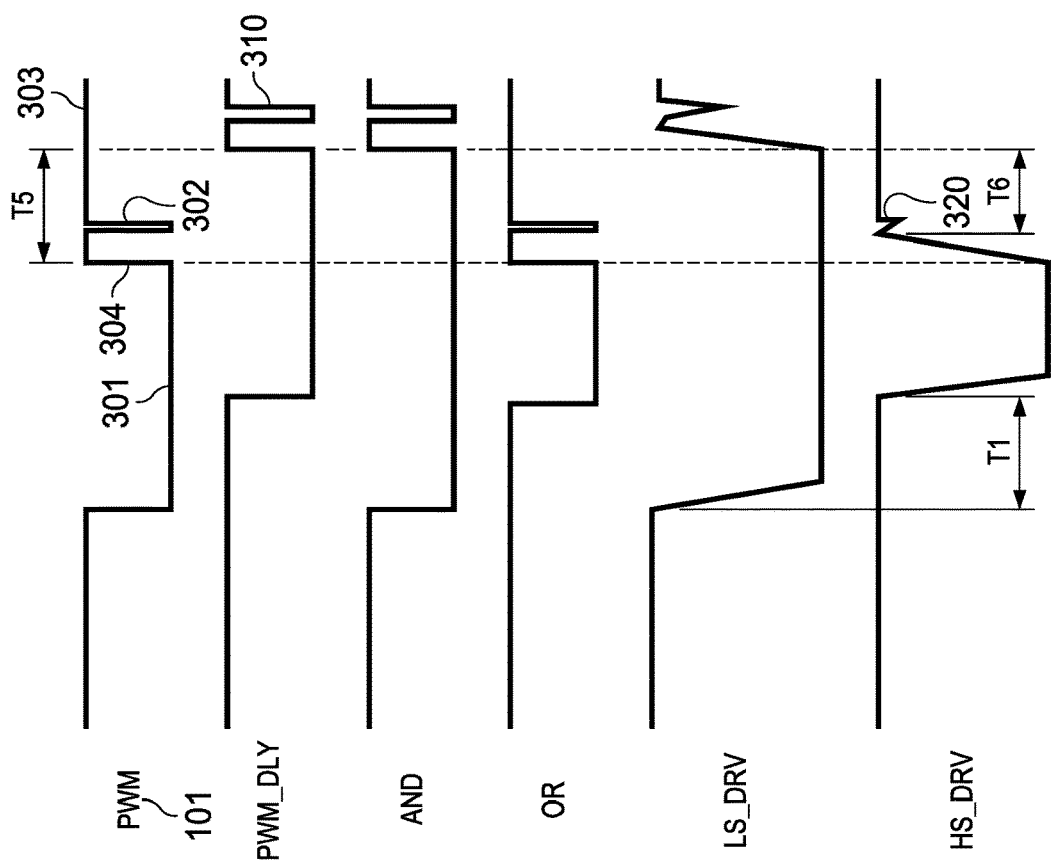
FIG. 3 also shows a timing diagram with a glitch on the pulse width modulation (PWM) signal.

Due to the abrupt change in the current from VDD through parasitic inductor Lpar, when HS transistor is turning OFF, ringing is present on the source of HS transistor. This voltage ringing can affect the generation of the PWM signal 101, and thus cause glitches to occur on the PWM signal 101. A glitch is an unintended voltage level. FIG. 3 illustrates an example in which a glitch 302 occurs on the PWM signal. The PWM signal 101 is intended to transition from a low level (301) to a high level (303) with a rising edge at 304. The PWM signal 101 transitions to a high level at edge 304, but then temporarily drops back to a logic low level (glitch 302) before again returning to the logic high level (303). The width T5 of the glitch 302 is substantially less than the non-overlap time T1.

The glitch 302 is also present in the PWM_DLY signal at 310. The glitch 302 causes the HS_DRV signal to experience a small dip at 320, but there is still a non-overlap time T6, albeit it slightly smaller than T1 due to the glitch.

Figure 4:
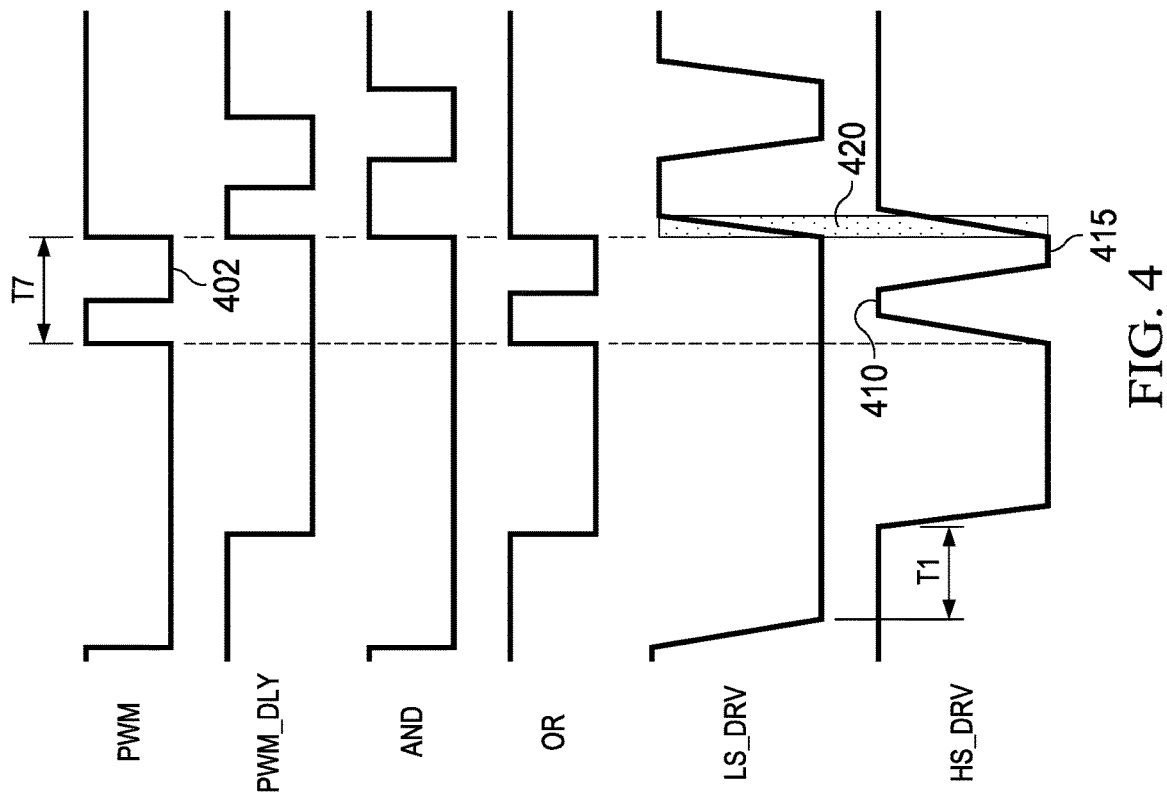
FIG. 4 also shows a timing diagram with a glitch on the PWM signal that is large enough to cause a shoot-through condition for the high and low transistors of the switching regulator.

In the example of FIG. 4, however, the glitch 402 is of a width T7 that approaches the intended non-overlap time T1. The HS FET turns off at 410, and due to the glitch 402, back on at 415. A "shoot-through" condition exists at 420 as both the HS and LS transistors are on simultaneously. The shoot-through condition causes an excessive current level to flow from VDD and through the HS and LS transistors to ground, thereby potentially damaging the transistors.

Figure 5:
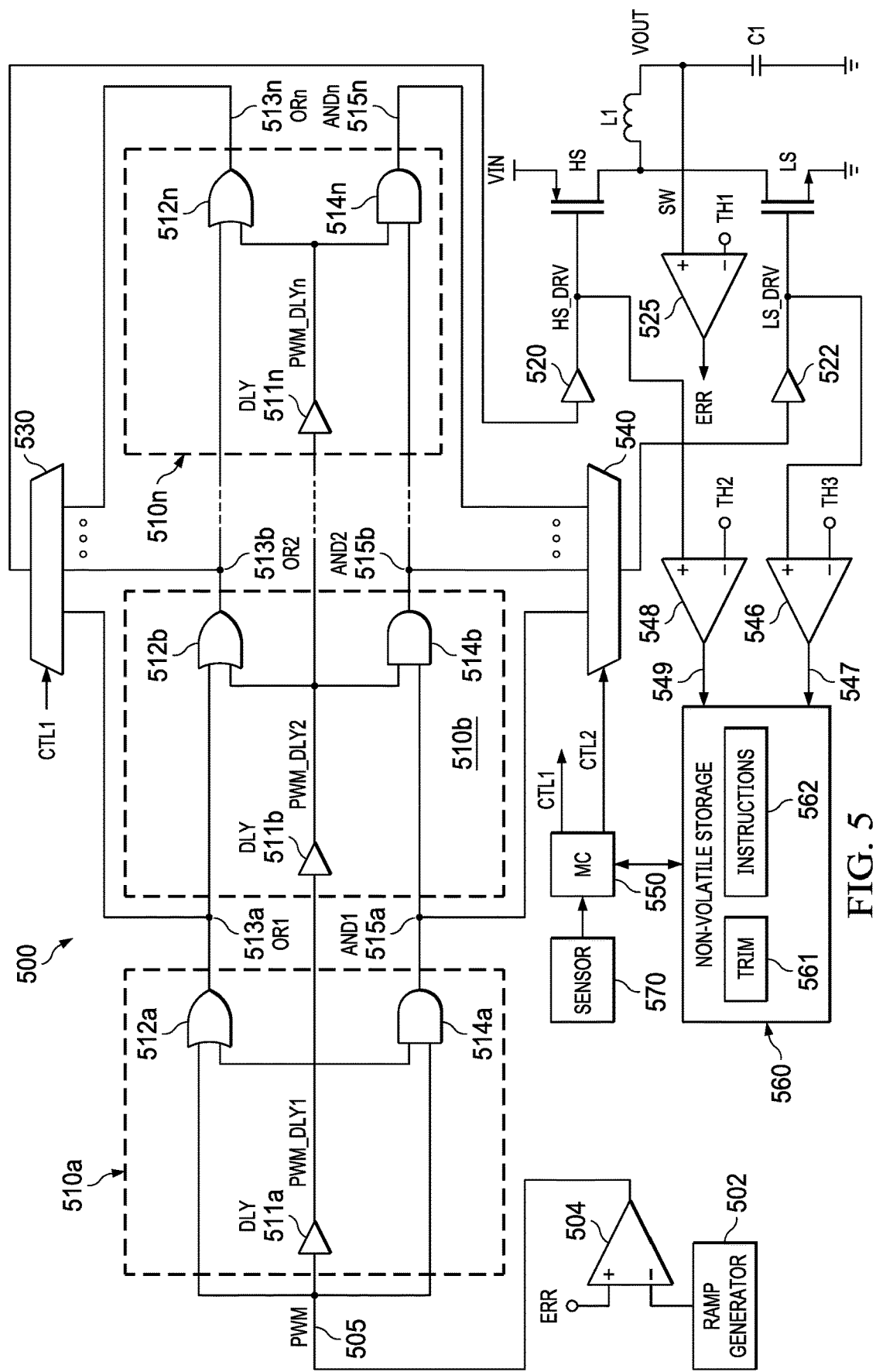
FIG. 5 illustrates an example of a switching regulator that includes a control circuit that can implement a configurable non-overlap time.

FIG. 5 shows an example of at least a portion of a switching regulator 500. The switching regulator 500 in this example includes a HS transistor and a LS transistor connected as described above—the source of the HS transistor connected to VDD, the source of the LS transistor connected to the ground node, and the drains of the HS and LS transistors connected together at the SW node. Inductor L1 connects to the SW node and to capacitor C1 as shown. Driver 520 generates the gate signal (HS_DRV) to the HS transistor, and driver 522 generates the gate signal (LS_DRV) to the LS transistor. The switching regulator 500 also includes a ramp generator 502, an error amplifier 525, comparators 504, 546, and 548, gate control circuits 510a, 510b, . . . , 510n (collectively gate control circuits 510), selection circuits 530 and 540, a microcontroller 550, a non-volatile storage device 560, and a sensor 570.

The error amplifier 525 receives as inputs the voltage on the Vout node and a reference voltage REF1 and generates an error output signal (ERR) based on the difference between the input signals. ERR is provided to the positive input of comparator 504. The comparator 504 compares ERR to a ramp signal from a ramp generator 502 and generates a PWM signal 505.

The gate control circuits 510 are connected in series as shown. Each gate control circuit 510 includes a time delay element, a first logic gate, and a second logic gate. Other components may be included within each gate control circuit 510. The first logic gate in this example comprises an OR gate, and the second logic gate comprises an AND gate. In other implementations, different types of logic gates than OR gates and AND gates are used, such as NOR gates and NAND gates. Gate control circuit 510a includes time delay element 511a, OR gate 512a, and AND gate 514a. Gate control circuit 510b includes time delay element 511b, OR gate 512b, and AND gate 514b. Gate control circuit 510n includes time delay element 511n, OR gate 512n, and AND gate 514n. In this example, three gate control circuits 510 are shown (n=3), but in other examples n is greater than or equal to 2 (that is n is 2, 3, 4, . . . ). In one example, n=16 (i.e., 16 gate control circuits 510).

The PWM signal 505 is provided to the input of the time delay element 511a, and the output of time delay element 511a is connected to the input of time delay element 511b, and so on. Thus, the time delay elements 511a, 511b, . . . , 511n are connected in series. Each time delay element generates an output signal that is identical to the input signal but delayed with respect to time by TD seconds (the time delay introduced by each time delay element 511). Thus, the output signal from the first time delay element 511a is delayed relative to the PWM signal 505 by TD seconds, and the output signal from the second time delay element 511b is delayed relative to the PWM signal 505 by 2×TD seconds, and so on. The output signal from the first time delay element 511a is designated the PWM_DLY1 signal. The output signal from the second time delay element 511b is designated the PWM_DLY2 signal. The output signal from the nth time delay element 511n is designated the PWM_DLYn signal.

The PWM signal 505 is also provided to one input of OR gate 512a and to an input of AND gate 514a. The other input to the OR gate 512a is coupled to the output of the time delay element 511a. Similarly, the other input to the AND gate 514a is coupled to the output of the time delay element 511a. Thus, the OR gate 512a logically OR's together the PWM signal 505 and its delayed version from the time delay element 511a to produce OR 513a. The AND gate 514a logically AND's together the PWM signal 505 and its delayed version from the time delay element 511a to produce AND 515a.

The output of OR gate 512a is coupled to an input of the OR gate 512b of the next gate control circuit 510b in the series chain of gate control circuits 510. The output of AND gate 514a is coupled to an input as well of AND gate 514b of the next gate control circuit 510b. The other inputs of OR gate 512b and AND gate 514b are coupled to the output of the time delay element 511b of gate control circuit 510b. The output signal from OR gate 512b is shown as OR2 513b, and the output signal from the AND gate 514b is shown as AND2 515b. The connections between adjacent gate control circuits 510 continues in this fashion to the last gate control circuit 510 in the series chain (i.e., gate control circuit 510n). The output signal from OR gate 512n is shown as ORn 513n, and the output signal from the AND gate 514n is shown as ANDn 515n.

The outputs of OR gates 512a-n are coupled to inputs of selection circuit 530. Similarly, the outputs of AND gates 514a-n are coupled to inputs of selection circuit 540. In the example of FIG. 5, the selection circuits 530 and 540 are implemented as multiplexers. A control signal (CTL1) is generated by the microcontroller 550 and is provided to selection circuit 530. A control signal (CTL2) also is generated by the microcontroller 550 and is provided to selection circuit 540. CTL1 and CTL2 cause one of the inputs of the respective selection circuits 530, 540 to be provided as the output signal from the selection circuit. In some examples, the same input of each selection circuit 530, 540 is selected as the output signal. For example, the signal on the second inputs of both selection circuits 530, 540 is selected. In one example, CTL1 and CTL2 is the same signal.

The output signal from selection circuit 530 is provided to the input of driver 520, and the output signal from selection circuit 540 is provided to the input of driver 522 to drive the gates of the respective HS and LS transistors. In this example, the HS_DRV signal is provided to an input (e.g., positive) of comparator 548, and the negative input of comparator 548 is coupled to a threshold voltage TH2. The LS_DRV signal is provided to a positive input of comparator 546, and the negative input of comparator 546 is coupled to a threshold voltage TH3. The use of the positive and negative inputs of the comparators can be reversed from that shown in FIG. 5. The output signal 549 from comparator 548 is indicative of whether the voltage of HS_DRV is smaller or larger than TH2. If HS_DRV is larger than TH2, the output signal 549 from comparator 548 will be a logic high; and logic low if HS_DRV is smaller than TH2. In one example, TH2 is a voltage that, for HS_DRV above that voltage, will cause the HS transistor to be off. Thus, if HS_DRV is high enough to turn off the HS transistor, the output signal 549 from comparator 548 will be logic high. The output signal 547 from comparator 546 is indicative of whether the voltage of LS_DRV is smaller or larger than TH3. If LS_DRV is smaller than TH3, the output signal 547 from comparator 546 will be a logic low; and logic high if LS_DRV is larger than TH3. In one example, TH3 is a voltage that for LS_DRV smaller than that voltage will cause the LS transistor to be off. Thus, if LS_DRV is small enough to turn off the LS transistor, the output signal 547 from comparator 546 will be logic low.

Through generation of CTL1 and CTL2, the microcontroller 550 causes the OR gate and AND gate output signals from a specific gate control circuit 510 to be used to control the on and off state of the HS and LS transistors. The non-volatile storage device 560 comprises random access memory (RAM), electrically-erasable programmable read-only memory (EEPROM), one storage device, multiple storage devices, solid-state storage, or any other type and combination of storage device(s). The non-volatile storage device 560 stores a trim code 561 that is accessed and used by the microcontroller 550 to generate CTL1 and CTL2. The non-volatile storage device 560 also stores instructions 562 which are retrieved and executed by the microcontroller 550. When executing the executable instructions, the microcontroller 550 performs the functionality described herein attributed to the microcontroller 550. Sensor 570 is coupled to the microcontroller 550. The microcontroller 550 obtains a sensor signal from the sensor 570 to thereby take a sensor reading. In one example, the sensor 570 comprises a temperature sensor. While one sensor 570 is shown in this example, multiple sensors may be present. The sensor 570 can comprise additional or different sensors than a temperature sensor.

Figure 6:
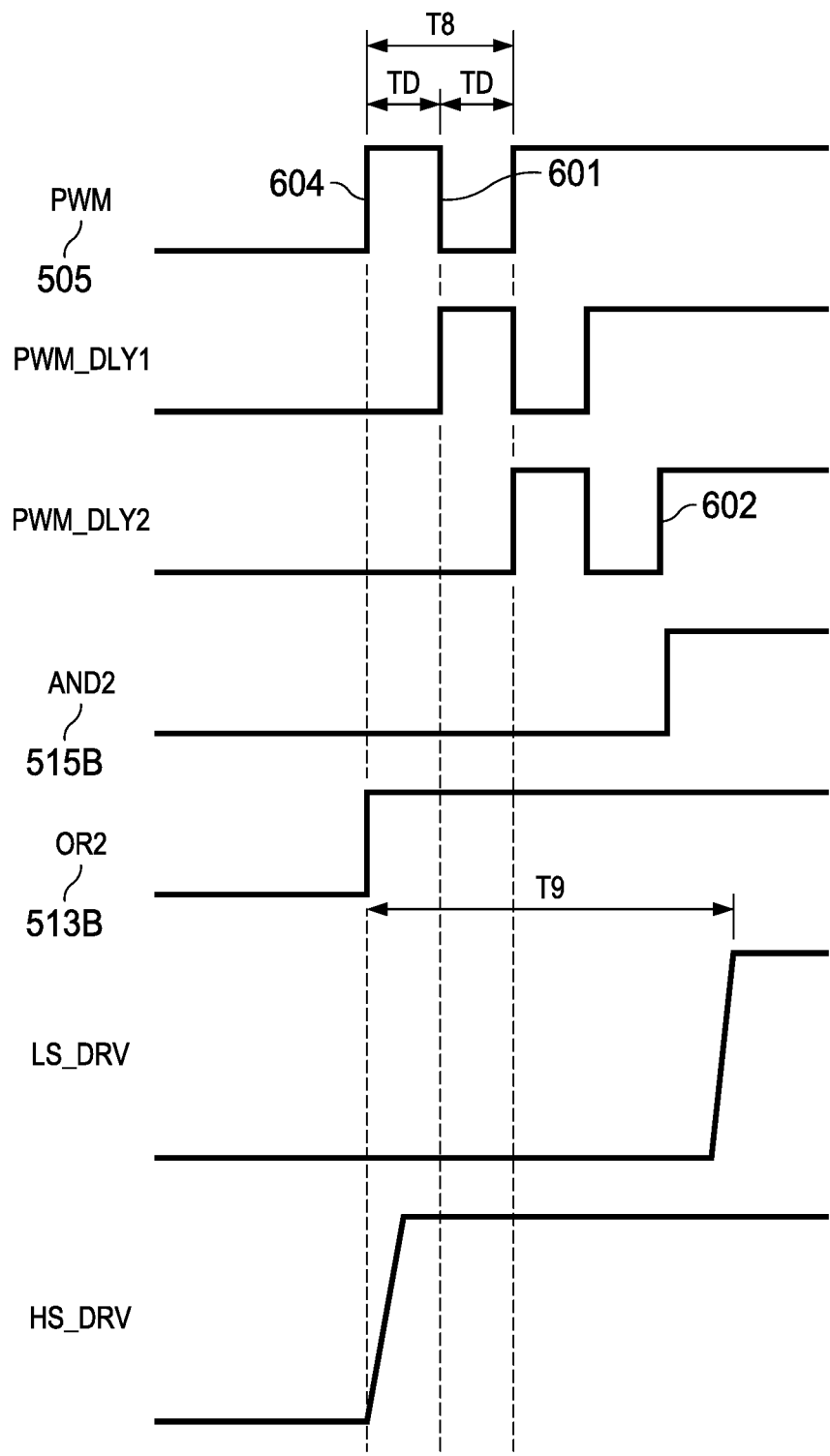
FIG. 6 shows an example of a timing diagram for the operation of the switching regulator of FIG. 5 with a glitch on the PWM signal.

The operation of the example switching regulator 500 of FIG. 5 will now be described with respect to the timing diagram of FIG. 6. FIG. 6 shows waveforms for the following signals: PWM signal 505, PWM_DLY1, PWM_DLY2, AND2 515b, OR2 513b, LS_DRV, and HS_DRV. A glitch 601 is shown on the PWM signal 505. In this example, the time delay TD introduced by each time delay element 511 is approximately one-half the width T8 of the glitch 601.

AND2 515b is the logical AND of the PWM signal 505, the PWM_DLY1 signal, and the PWM_DLY2 signal, and thus is logic low as long as at least one of those three signals is low, which is the case until the rising edge 602 of PWM_DLY2 signal occurs. OR2 513b is the logical OR of the PWM signal 505, the PWM_DLY1 signal, and the PWM_DLY2 signal, and thus is logic high as long as at least one of those three signals is high, which is the case upon the occurrence of rising edge 604 of the PWM signal 505. As such, the duration T9 of the non-overlap period is the sum of the time delays of time delay element 511a and time delay element 511b and the width of the glitch 601.? As such, despite the glitch 601 on the PWM signal 505, no shoot-through occurs. That is, the HS and LS transistors are not on simultaneously.

Figure 7:
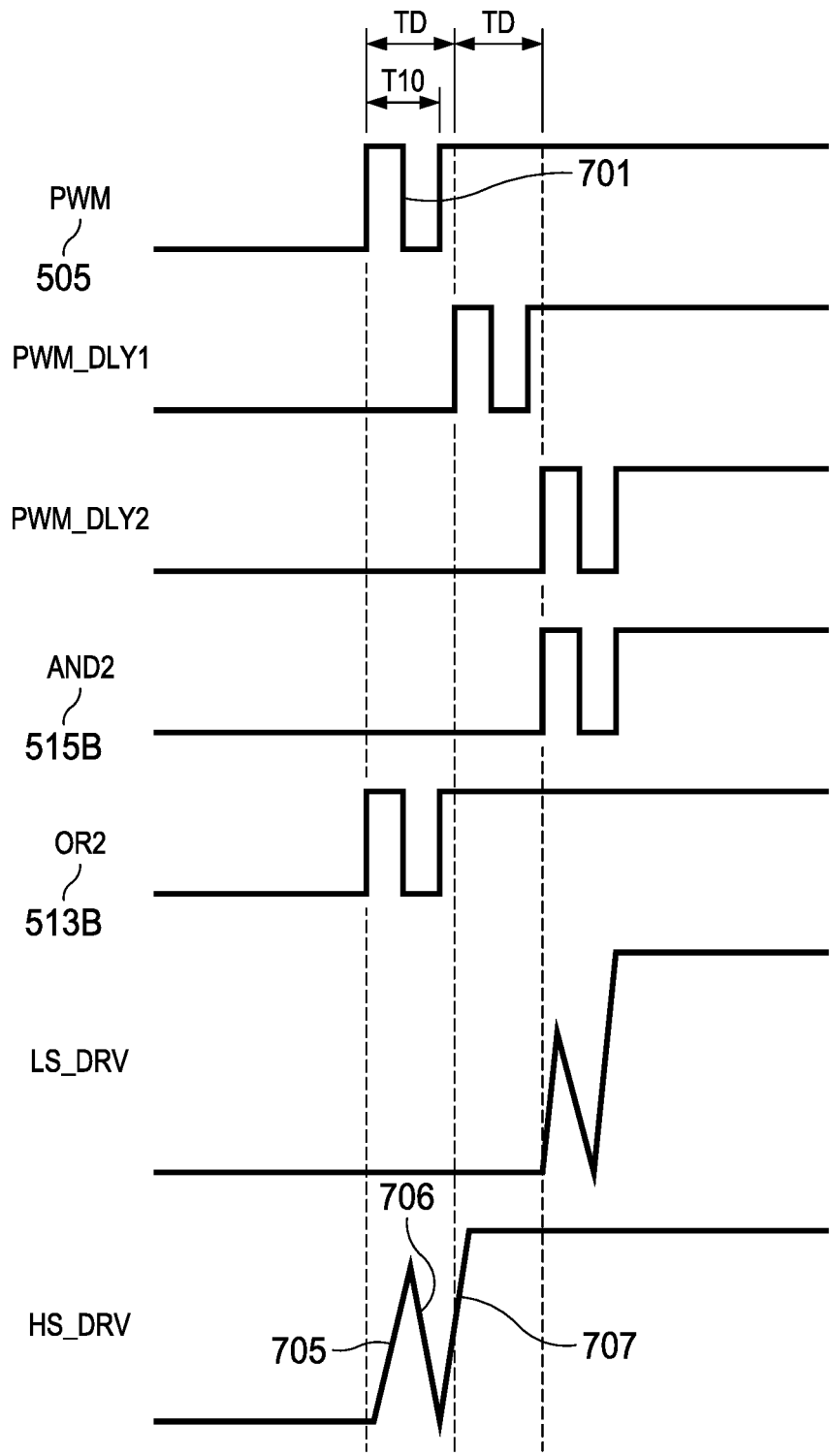
FIG. 7 shows an example of another timing diagram for the operation of the switching regulator of FIG. 5 with a glitch on the PWM signal.

FIG. 7 shows an example in which a glitch 701 is present on PWM signal 505. The width T10 of glitch 701 is smaller than the time delay TD of each time delay element 511. However, a shoot-through condition still does not occur. The HS_DRV signal increases at 705, but, due to the glitch 701, begins to decrease again at 706 to possibly momentarily turning the HS transistor back ON. The glitch 701 ends and the HS_DRV signal increases again at 707, and the HS transistor turns off before the LS_DRV signal becomes high enough to turn on the LS transistor.

Figure 8:
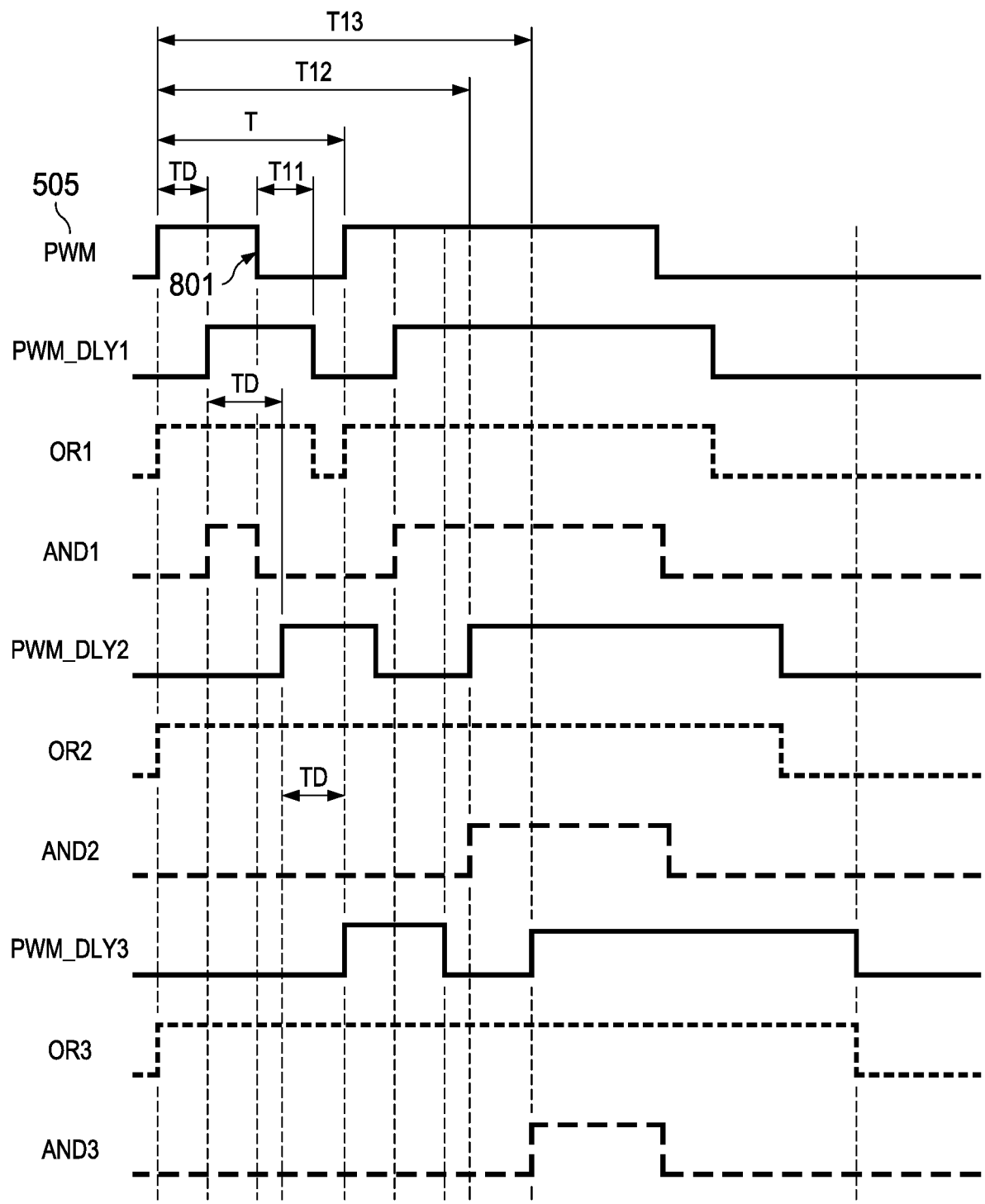
FIG. 8 shows yet another timing diagram for the operation of the switching regulator of FIG. 5 with a glitch on the PWM signal.

FIG. 8 shows a timing diagram illustrating the operation of the switching regulator 500 with three gate control circuits 510. A PWM signal 505 is shown with a glitch 801, which flows through to the output of each of the three gate control circuit's time delay elements 511—PWM_DLY1, PWM_DLY2, and PWM_DLY3. Each PWM_DLY signal has the same waveform but is time delayed from its immediately preceding PWM_DLY signal by the time delay TD introduced by each of the respective time delay elements 511. The OR and AND signals from each of the three gate control circuits 510 are shown as well. OR1 and AND1 represent the OR and AND gate output signals, respectively, from the first gate control circuit 510a (i.e., the gate control circuit that receives the PWM signal 505). OR2 and AND2 represent the OR and AND gate output signals, respectively, from the second gate control circuit 510b. OR3 and AND3 represent the OR and AND gate output signals, respectively, from the third gate control circuit. Time T11 represents the non-overlap time interval associated with the first gate control circuit 510a. Time T12 represents the non-overlap time interval associated with the second gate control circuit 510b, and time T13 represents the non-overlap time interval associated with the third gate control circuit. As can be seen, each subsequent gate control circuit 510 in the series chain implements a longer non-overlap time interval than the preceding gate control circuit.

Referring again to the example of FIG. 5, the OR 513 from each gate control circuit 510 is provided to a respective input of selection circuit 530. AND 515 from each gate control circuit 510 is provided to a respective input of selection circuit 540. The selection circuit 530 provides one of its input OR signals as its output signal depending on the state of the CTL1 control signal from the microcontroller 550. Similarly, the selection circuit 540 provides one of its input AND signals as its output signal depending on the state of the CTL2 control signal from the microcontroller 550. The selected output signal from the selection circuit 530 is provided to driver 520 to control the on/off state of the HS transistor. The selected output signal from the selection circuit 540 is provided to driver 522 to control the on/off state of the LS transistor. In one implementation, the microcontroller 550 asserts the CTL1 and CTL2 control signals to cause the same gate control circuit 510 to have its OR and AND signals selected to control the gates of the corresponding HS and LS transistors. For example, CTL1 and CTL2 may be asserted such that OR2 and AND2 are used to control the on/off states of the HS and LS transistors. A trim code 561 is stored in the non-volatile storage 560. The microcontroller 550 generates the CTL1 and CTL2 control signals based on the trim code 561.

Figure 9:
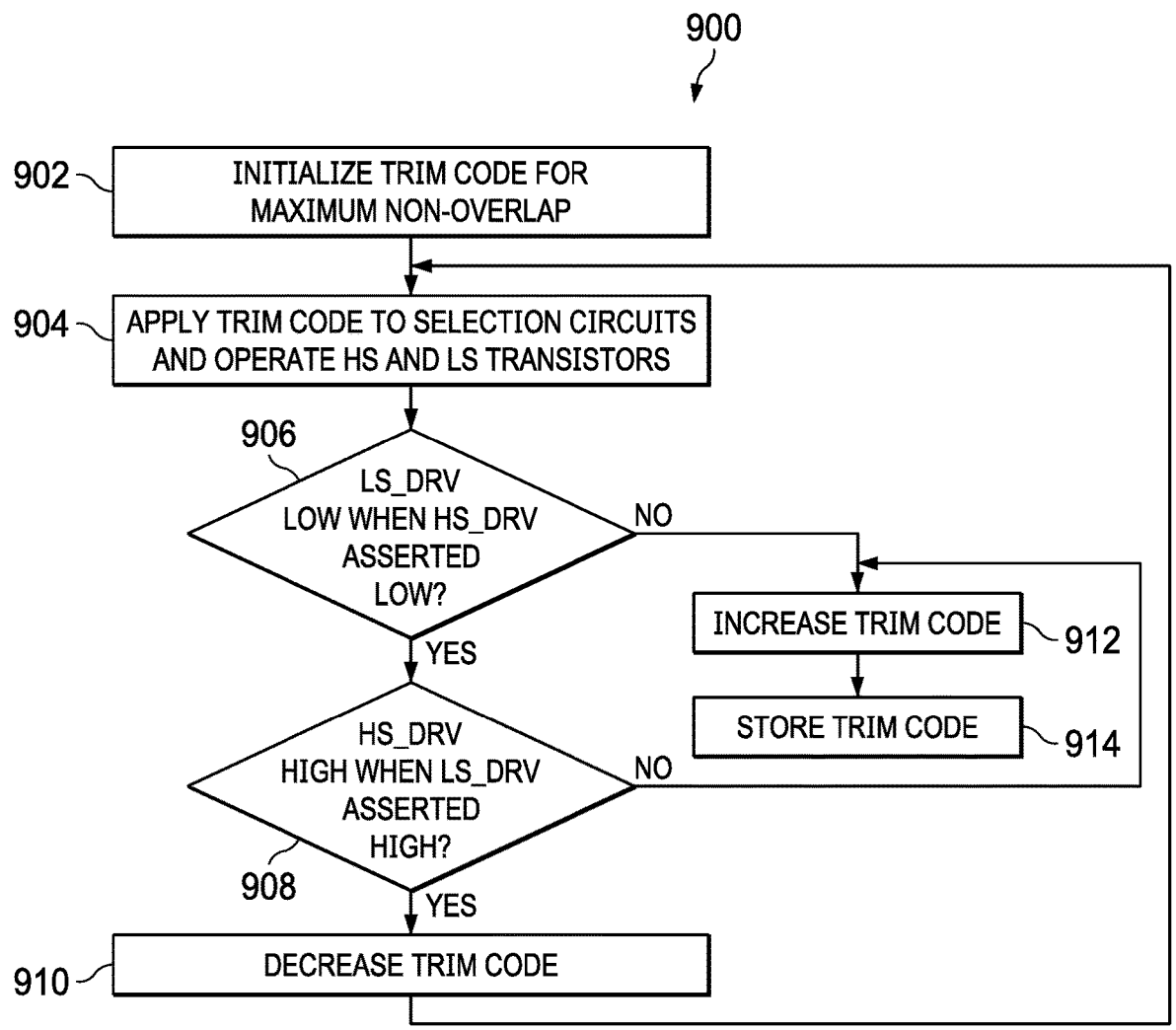
FIG. 9 shows an example of a method for calibrating the non-overlap time of the switching regulator.

FIG. 9 includes an example of a calibration process 900 to determine a suitable trim code 561. The calibration process 900 of FIG. 9 can be performed each time power is enabled to the switching regulator 500. Additionally, or alternatively, the example calibration process 900 is triggered as a result of a signal from sensor 570. In one example, the sensor 570 includes a temperature sensor. The microcontroller 550 continually or periodically monitors temperature readings from sensor 570. When the microcontroller 550 determines that temperature has changed by more than a threshold amount, the microcontroller 550 performs the calibration process of FIG. 9. For example, the microcontroller 550 performs the calibration process 900 upon a determination that the temperature has changed by more than a threshold percentage (or threshold temperature amount) from the temperature when the calibration process was last performed. Some of the instructions 562 include instructions that, when executed by the microcontroller 550, cause the microcontroller to perform the calibration process shown in FIG. 9.

At 902, the calibration process includes initializing the trim code for the maximum non-overlap time period. As explained above regarding the timing diagram of FIG. 8, the maximum non-overlap time period occurs from the use of the OR and AND signals 513, 515 from the last (nth) gate control circuit 510n. At 904, the calibration process 900 includes using the trim code to generate the corresponding CTL1 and CTL2 control signals to the selection circuits 530 and 540 to thereby operate the HS and LS transistors. The HS and LS transistors will be turned on and off in accordance with the selected OR and AND signals 513, 515. The amount of non-overlap time will be the maximum possible form the set of gate control circuits 510.

At 906, the microcontroller 550 determines whether the LS_DRV signal is low when the HS_DRV signal is asserted low. The LS_DRV signal being low in this example means that the LS transistor is off. The HS_DRV signal is compared to TH2 by comparator 548, and the LS_DRV signal is compared to TH3 by comparator 546. The output signals 549 and 547 from comparators 548 and 546 indicate whether the corresponding gate drive signal is greater or smaller than the respective threshold voltage TH2 and TH3. Operation 906 is performed by the microcontroller 550 determining whether output signal 547 from comparator 546 is low or high when the HS_DRV signal is asserted low to turn on the HS transistor. Output signal 547 being low means that the LS transistor is OFF, whereas the output signal 547 being high means that the LS transistor is ON.

If the LS_DRV signal is low when the HS_DRV signal is asserted low, then the HS transistor has been turned on while the LS transistor was off, and the calibration process continues at operation 908. At 908, the microcontroller 550 determines whether the HS_DRV signal is high when the LS_DRV signal is asserted high. The HS_DRV signal being high in this example means that the HS transistor is off. Operation 908 is performed by the microcontroller 550 determining whether output signal 549 from comparator 548 is low or high when the LS_DRV signal is asserted high to turn on the LS transistor. Output signal 549 being high means that the HS transistor is OFF, whereas the output signal 549 being low means that the HS transistor is ON.

If the both the "yes" branches of operations 906 and 908 are taken (i.e., the LS and HS transistors are not both ON simultaneously), then it is possible that the current trim code is larger than it needs to be. For increased efficiency, the non-overlap time period should exist to avoid a shoot-through condition, but not be any larger than necessary. Thus, at 910, the calibration process includes decreasing the trim code. Decreasing the trim code results in changing the state of the CTL1 and CTL2 control signals to select OR and AND signals from a gate control circuit 510 that implements a smaller non-overlap time period. Control loops back to operation 904 and the process repeats.

Either of the "no" branches from 906 or 908 means that both the HS and LS transistors were determined to be on simultaneously, and thus a shoot-through condition was detected. Detection of a shoot-through condition means that the trim code has been decreased so much that the non-overlap time period is too small resulting in a shoot-through condition. Control then passes to operation 912, and the current trim code is increased back to its previous larger value which resulted in a sufficiently large non-overlap time (no shoot-through). At 914, the resulting trim code is then stored in the non-volatile storage device 560.

The switching regulator 500 of FIG. 5 includes multiple gate control circuits 510, whereas the switching regulator 100 of FIG. 1 includes only one time delay element 102, OR gate 104, and AND gate 106. With additional gate control circuits 510, the example of FIG. 5 consumes additional power than the example of FIG. 1. However, the additional power consumption due to the OR and AND logic gates 512, 514 as well as the additional time delay elements 511 is a relatively small fraction of the total power budget for a switching regulator.

In this description, the term "couple" or "couples" means either an indirect or direct wired or wireless connection. Thus, if a first device couples to a second device, that connection may be through a direct connection or through an indirect connection via other devices and connections. Modifications are possible in the described embodiments, and other embodiments are possible, within the scope of the claims.

What is claimed is:

1. A circuit, comprising:
   a first gate control circuit including a first time delay element, a first logic gate, and a second logic gate, the first time delay element including an output, wherein the first time delay element, the first logic gate, and the second logic gate are configured to receive a pulse width modulation (PWM) signal, and wherein the first logic gate includes a first output and the second logic gate includes a second output;

a second gate control circuit including a second time delay element, a third logic gate, and a fourth logic gate, wherein the second time delay element includes an input coupled to the output of the first time delay element, the second time delay element includes an output, the third logic gate includes a third output, and the fourth logic gate includes a fourth output;
a first gate driver configured to receive a first signal from one of the first or third outputs;
a first selection circuit coupled to the first and third output and configured to provide the first signal from one of the first or third output to the first gate driver;
a second gate driver configured to receive a second signal from one of the second or fourth outputs; and
a second selection circuit coupled to the second and fourth output and configured to provide the second signal from one of the second or fourth output to the second gate driver.

2. The circuit of claim 1, wherein the first selection circuit is configured to provide the first signal to the first gate driver from the first output, and the second selection circuit is configured to provide the second signal to the second gate driver from the second output.

3. The circuit of claim 1, wherein, the first gate driver is configured to receive the first signal from the third output, and the second gate driver is configured to receive the second signal from the fourth output.

4. The circuit of claim 1, wherein:
the first logic gate comprises a first OR gate and the second logic gate comprises a first AND gate, the first OR gate including first and second OR gate inputs and a first OR gate output, and the first AND gate including first and second AND gate inputs and a first AND gate output, the first OR gate input is configured to receive the PWM signal, the second OR gate input is coupled to the output of the first time delay element, the first AND gate input is configured to receive the PWM signal, and the second AND gate input is coupled to the output of the first time delay element; and
the third logic gate comprises a second OR gate and the fourth logic gate comprises a second AND gate, the second OR gate includes third and fourth OR gate inputs and the second AND gate including third and fourth AND gate inputs.

5. The circuit of claim 4, wherein the third OR gate input is coupled to the first OR gate output, the fourth OR gate input is coupled to the output of the second time delay element, the third AND gate input is coupled to the first AND gate output, and the fourth AND gate input is coupled to the output of the second time delay element.

6. The circuit of claim 1, further including a non-volatile storage device configured to store a trim code, the trim code usable to select one of the first and third output to provide the first signal to the first gate driver, and to select one of the second and fourth output to provide the second signal to the second gate driver.

7. The circuit of claim 1, further comprising:
a temperature sensor; and
a microcontroller coupled to the temperature sensor;
wherein, responsive to a temperature signal from the temperature sensor crossing a temperature threshold, the microcontroller is configured to determine which of the first or third outputs is to provide the first signal to the first driver, and which of the second or fourth outputs is to provide the second signal to the second driver.

8. A circuit, comprising:
a first transistor control circuit including a first time delay element configured to receive a pulse width modulation (PWM) signal, the first transistor control circuit including a first output and a second output, and the first time delay element including a first time delay element output;
a second transistor control circuit including a second time delay element having a second time delay element input coupled to the first time delay element output, the second gate control circuit including a first input coupled to the first output and including a second input coupled to the second output, the second transistor control circuit including a third output and a fourth output;
a first selection circuit including first and second selection circuit inputs, a first selection control signal, and a first selection circuit output, the first selection circuit input coupled to the first output, and the second selection circuit input coupled to the third output;
a first transistor driver coupled to the first selection circuit output;
a second selection circuit including third and fourth selection circuit inputs, a second selection control signal, and a second selection circuit output, the third selection circuit input coupled to the second output, and the second selection circuit input coupled to the fourth output; and
a second transistor driver coupled to the second selection circuit output.

9. The circuit of claim 8, further comprising a first transistor having a control input coupled to the first transistor driver, and comprising a second transistor having a control input coupled to the second transistor driver.

10. The circuit of claim 8, wherein:
the first transistor control circuit includes a first logic gate and a second logic gate, the first logic gate including first and second logic gate inputs and a first logic gate output, and the second logic gate including third and fourth logic gate inputs and a second logic gate output, the first logic gate input is configured to receive the PWM signal, the second logic gate input is coupled to the first time delay element output, the third logic gate input is configured to receive the PWM signal, and the fourth logic gate input is coupled to the output of the first time delay element; and
the second transistor control circuit comprises a third logic gate and a fourth logic gate, the third logic gate including fifth and sixth logic gate inputs and a third logic gate output, and the fourth logic gate including seventh and eighth logic gate inputs and a fourth logic gate output, wherein the fifth logic gate input is coupled to the first logic gate output, the sixth logic gate input is coupled to the second time delay element output, the seventh logic gate input is coupled to the second logic gate output, and the eighth logic gate input is coupled to the second time delay element output.

11. The circuit of claim 8, further comprising:
a temperature sensor; and
a microcontroller coupled to the temperature sensor;
wherein, responsive to a temperature signal from the temperature sensor crossing a temperature threshold, the microcontroller is configured to determine a state of the first selection control signal and a state of the second selection control signal.

12. The circuit of claim 8, further comprising a microcontroller, wherein upon a power-on event of the circuit, the microcontroller is configured to determine a trim code for controlling the states of the first and second selection circuits.

13. The circuit of claim 12, further comprising a first transistor having a control input coupled to the first transistor driver, and comprising a second transistor having a control input coupled to the second transistor driver, and wherein the microcontroller determines the trim code to avoid having both the first and second transistors simultaneously in an ON state.

14. A circuit, comprising:
a plurality of gate control circuits coupled in series, each of the plurality of gate control circuits including a time delay element having a time delay element output, the time delay elements of the plurality of gate control circuits coupled in series, and each of the plurality of gate control circuits including a first logic gate and a second logic gate, wherein each of the first logic gates has a first logic gate output and each of the second logic gates has a second logic gate output, and wherein the time delay output of each of the plurality of gate control circuits is coupled to an input of the first logic gate and to an input of the second logic gate of a respective one of the gate control circuits;

a first selection circuit including a plurality of inputs, each of the plurality of inputs of the first selection circuit separately coupled to a respective one of the first logic gate outputs, and the first selection circuit having a first selection circuit output;

a second selection circuit including a plurality of inputs, each of the plurality of inputs of the second selection circuit coupled to a separate one of the second logic gate outputs, and the second selection circuit having a second selection circuit output;

a first gate driver coupled to the first selection circuit output; and a second gate driver coupled to the second selection circuit output.

15. The circuit of claim 14, further comprising a microcontroller, wherein upon a power-on event of the circuit, the microcontroller is configured to determine a trim code for controlling the states of the first and second selection circuits.

16. The circuit of claim 15, further comprising a first transistor having a first gate coupled to the first gate driver, and comprising a second transistor having a second gate coupled to the second gate driver, and wherein the microcontroller determines the trim code to avoid having both the first and second transistors simultaneously in an ON state.

* * * * *